(12) United States Patent
Kapoor

(10) Patent No.: US 7,304,526 B2
(45) Date of Patent: Dec. 4, 2007

(54) SWITCHING CIRCUIT FOR HANDLING SIGNAL VOLTAGES GREATER THAN THE SUPPLY VOLTAGE

(75) Inventor: Ajay Kapoor, Nijmegen (NL)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 10/577,085

(22) PCT Filed: Oct. 13, 2004

(86) PCT No.: PCT/IB2004/052081

§ 371 (c)(1),
(2), (4) Date: Apr. 24, 2006

(87) PCT Pub. No.: WO2005/041409

PCT Pub. Date: May 6, 2005

(65) Prior Publication Data

US 2007/0080737 A1 Apr. 12, 2007

(30) Foreign Application Priority Data

Oct. 23, 2003 (EP) .................................. 03103938

(51) Int. Cl.
*H03K 17/687* (2006.01)
(52) U.S. Cl. ...................... 327/427; 327/434; 327/387; 327/388; 327/389; 327/391
(58) Field of Classification Search ................ 327/416, 327/419, 427, 434–437, 318, 319, 333, 379, 327/382–384, 387–389, 391
See application file for complete search history.

(56) References Cited

U.S. PATENT DOCUMENTS 5,666,082 A    9/1997  Wilenken et al.
5,994,744 A    11/1999 Katayama et al.
6,163,199 A  * 12/2000 Miske et al. ................. 327/434
6,359,496 B1 *  3/2002 Steinhagen .................. 327/391

(Continued)

FOREIGN PATENT DOCUMENTS

JP          09252241          9/1997

OTHER PUBLICATIONS

Wilenken R N: "Fault-Tolerant Analogue Switches"; Electronic Engineering, Morgan-Grampian LTD; London GB; vol. 71, No. 872; Sep. 1999; pp. 17-18, 20.

*Primary Examiner*—Tuan T. Lam
*Assistant Examiner*—Patrick O'Neill

(57) ABSTRACT

Analog bidirectional switches (20) comprising a first (1) and a second (2) transistor function badly in case of the signal voltage at an input or an output of the switch (20) exceeding the supply voltage used for operating the switch (20). By providing the switch (20) with a circuit (21), a second control signal ("f") destined for the second transistor (2) is no longer generated by solely inverting a first control signal ("e") destined for the first tranistor (1), but is generated in response to the first control signal ("e") and by taking into account the in/output signal ("z") at an in/output of the switch (20). The circuit (21) comprises a generator (22) for generating the second control signal ("f") having either a fixed value or a value of the in/output signal ("z"), and comprises a detector (23) for supplying the in/output signal ("z") to the generator (22). A further circuit (24) comprises a further generator for generating a backgate signal ("bg") destined for the second transistor (2).

16 Claims, 3 Drawing Sheets

U.S. PATENT DOCUMENTS

| | | |
|---|---|---|
| 6,567,024 B1 * | 5/2003 | Ishikawa .................... 341/136 |
| 6,700,431 B1 * | 3/2004 | Fotouhi et al. ............. 327/404 |
| 6,774,831 B2 * | 8/2004 | Saito ......................... 341/141 |
| 6,924,694 B2 * | 8/2005 | Kinugasa et al. ........... 327/566 |
| 2004/0119522 A1 * | 6/2004 | Tachibana et al. .......... 327/390 |

* cited by examiner

SWITCHING CIRCUIT FOR HANDLING SIGNAL VOLTAGES GREATER THAN THE SUPPLY VOLTAGE

The invention relates to a switch comprising a first and a second transistor, and to an apparatus comprising such a switch.

Examples of such an apparatus are audio/video transceivers like mobile phones and further audio/video equipment.

A prior art switch is known from JP 09252241 A, which discloses in its fifth drawing a switch comprising a first and a second transistor. First main electrodes of each transistor are coupled to each other and constitute an input, second main electrodes of each transistor are coupled to each other and constitute an output, and a control electrode of the first transistor constitutes a control input of the switch for bringing the switch into an enable or a disable mode. A control electrode of the second transistor is coupled via an inverter to the control electrode of the first transistor.

In case of the signal voltage at an input or an output of the switch exceeding the supply voltage used for operating the switch, several problems may occur. Firstly, in a disable mode, a current may start to flow between the I/O lines of the switch. Secondly, backgate diodes may start to leak to the supply voltage. And thirdly, in an enable mode, the signal voltage at an I/O line of the switch may be clipped.

The known switch is disadvantageous, inter alia, due to, in case of the signal voltages at the input or the output of the switch being larger than the supply voltage, functioning relatively badly.

It is an object of the invention, inter alia, to provide a switch comprising a first and a second transistor which, in case of the signal voltages at the input or the output of the switch being larger than the supply voltage, functions relatively well.

A further object of the invention is, inter alia, to provide an apparatus comprising such a switch which, in case of the signal voltages at the input or the output of the switch being larger than the supply voltage, functions relatively well.

The switch according to the invention comprises a first transistor with main electrodes constituting in/outputs of the switch and with a control electrode constituting a first control input of the switch for in response to a first control signal controlling the first transistor;

a second transistor with main electrodes constituting the in/outputs of the switch and with a control electrode constituting a second control input of the switch for in response to a second control signal controlling the second transistor; and a circuit for in response to the first control signal and an in/output signal at an in/output of the switch generating the second control signal.

By providing the switch with the circuit, the second control signal is no longer generated by solely inverting the first control signal, but is generated in response to the first control signal and by taking into account the in/output signal at an in/output of the switch. So, in case of an amplitude voltage of this in/output signal at an in/output of the switch exceeding the supply voltage used for operating the switch, dependently on the mode of the switch defined by the first control signal, the second control signal can be adapted accordingly. As a result, the disadvantageous clipping and leaking is strongly reduced. The switch according to the invention handles in/output signals having an amplitude voltage exceeding the supply voltage better than prior art switches.

A first embodiment of the switch according to the invention is defined by the circuit comprising a generator for, in an enable mode with the first control signal having a first value, generating the second control signal having a second value. In the enable mode, the second control signal is generated by advantageously solely inverting the first control signal. The first value for example corresponds with the supply voltage, and the second value with the ground voltage.

A second embodiment of the switch according to the invention is defined by the circuit further comprising a detector for, in a disable mode with the first control signal having the second value, supplying the in/output signal to the generator for generating the second control signal having the first value in case of a value of the in/output signal being smaller than the first value and having the value of the in/output signal in case of the value of the in/output signal being larger than the first value. In the disable mode, the second control signal is generated by advantageously solely inverting the first control signal in case of the value of the in/output signal being smaller than the supply voltage and by advantageously selecting the value of the in/output signal in case of the value of the in/output signal being larger than the supply voltage.

A third embodiment of the switch according to the invention is defined by further comprising a further circuit for in response to the first control signal and an in/output signal at an in/output of the switch generating a backgate signal destined for the second transistor. In the disable mode, in prior art switches the backgate of the second transistor is coupled to the supply voltage. By providing the switch according to the invention with the further circuit, the backgate is no longer coupled fixedly to the supply voltage, but a backgate signal destined for the backgate of the second transistor is generated advantageously flexibly in response to the first control signal and by taking into account the in/output signal at an in/output of the switch.

A fourth embodiment of the switch according to the invention is defined by the further circuit comprising a further generator for, in an enable mode with the first control signal having a first value, generating the backgate signal having a value of the in/output signal and for, in a disable mode with the first control signal having a second value, generating the backgate signal having the first value in case of a value of the in/output signal being smaller than the first value and having the value of the in/output signal in case of the value of the in/output signal being larger than the first value. In the enable mode, the backgate signal is generated by selecting the in/output signal, and in the disable mode, the backgate signal is generated by coupling the backgate to the supply voltage in case of a value of the in/output signal being smaller than the supply voltage and is generated by advantageously selecting the in/output signal in case of the value of the in/output signal being larger than the supply voltage.

A fifth embodiment of the switch according to the invention is defined by the generator comprising a third and a fourth transistor of which first main electrodes are coupled to each other and second main electrodes are coupled to each other, which first main electrodes are further coupled to a first main electrode of a fifth transistor, which second main electrodes are further coupled to first main electrodes of a sixth, seventh and eighth transistor for generating the second control signal, with a control electrode of the third transistor being coupled to first main electrodes of a ninth and a tenth transistor, with second main electrodes of the seventh, eighth and tenth transistor being coupled to each other, with a control electrode of the seventh transistor being coupled to the first main electrode of the seventh transistor, and with control electrodes of the fifth, sixth, ninth and tenth transistor receiving the first control signal or a derived version thereof. Usually, the fifth, sixth and ninth transistor will receive the first control signal, with the tenth transistor then receiving the derived (inverted) version of the first control signal. This generator has a simple, reliable and low cost construction.

A sixth embodiment of the switch according to the invention is defined by a detector comprising an eleventh and a twelfth transistor of which first main electrodes are coupled to each other for receiving the in/output signal or a derived version thereof, with a second main electrode of the eleventh transistor being coupled to a control electrode of the twelfth transistor and to a first main electrode of a thirteenth transistor, with a second main electrode of the twelfth transistor being coupled to a control electrode of the eleventh transistor and to a first main electrode of a fourteenth transistor and to the second main electrodes of the seventh, eighth and tenth transistor, with control electrodes of the thirteenth and fourteenth transistor receiving the first control signal or a derived version thereof. Usually, the fourteenth transistor will receive the first control signal, with the thirteenth transistor then receiving the derived (inverted) version of the first control signal. This detector has a simple, reliable and low cost construction.

A seventh embodiment of the switch according to the invention is defined by a further generator comprising a fifteenth and a sixteenth transistor of which first main electrodes are coupled to each other for receiving the in/output signal or a derived version thereof and second main electrodes are coupled to each other and to a first main electrode of a seventeenth transistor for generating a backgate signal, with a second main electrode of the seventeenth transistor being coupled to a first main electrode of an eighteenth transistor, with control electrodes of the fifteenth, sixteenth and seventeenth transistor receiving the first control signal or a derived version thereof, and with a control electrode of the eighteenth transistor receiving the in/output signal or a derived version thereof. Usually, the sixteenth and seventeenth transistor will receive the first control signal, with the fifteenth transistor then receiving the derived (inverted) version of the first control signal. This further generator has a simple, reliable and low cost construction.

An eighth embodiment of the switch according to the invention is defined by the second transistor being a PMOS having a backgate for receiving the backgate signal, with the third and tenth transistor each being a PMOS having a backgate coupled to its second main electrode, with the seventh and eighth transistor each being a PMOS having a backgate coupled to its first main electrode, with the eleventh and twelfth transistor each being a PMOS having a backgate coupled to its first main electrode, with the fifteenth and seventeenth transistor each being a PMOS having a backgate coupled to its second main electrode, with the eighteenth transistor being a PMOS having a backgate coupled to its first main electrode, and with all other transistors each being a NMOS. This switch has a simple, reliable and low cost construction.

Embodiments of the apparatus according to the invention comprising the switch according to the invention correspond with the embodiments of the switch according to the invention. A first stage of the apparatus coupled to a first in/output of the switch for example corresponds with a high-frequency stage and/or a modulating/demodulating stage and a second stage of the apparatus coupled to a second in/output of the switch for example corresponds with a low-frequency stage and/or an amplifying stage.

The invention is based upon an insight, inter alia, that the second transistor is mainly responsible for the problems occurring in case of an amplitude voltage of the in/output signal at an in/output of the switch exceeding the supply voltage used for operating the switch, and is based upon a basic idea, inter alia, that the second control signal for controlling this second transistor should be generated in response to the first control signal and by taking into account the in/output signal at an in/output of the switch.

The invention solves the problem, inter alia, of providing a switch which functions relatively well, even in case of an amplitude voltage of the in/output signal at an in/output of the switch exceeding the supply voltage used for operating the switch, and is advantageous, inter alia, in that larger amplitude voltages of the in/output signal at an in/output of the switch can be handled without the need to increase the supply voltage up to the level of the in/output signal, whereby the disadvantageous clipping and leaking is strongly reduced. The switch according to the invention handles in/output signals having an amplitude voltage exceeding the supply voltage better than prior art switches. This also helps with respect to the portability of the switch in different systems and in-between different systems, where power supplies are different from each other and/or from the power supply of the switch.

These and other aspects of the invention will be apparent from and elucidated with reference to the embodiments(s) described hereinafter.

Figure 1:
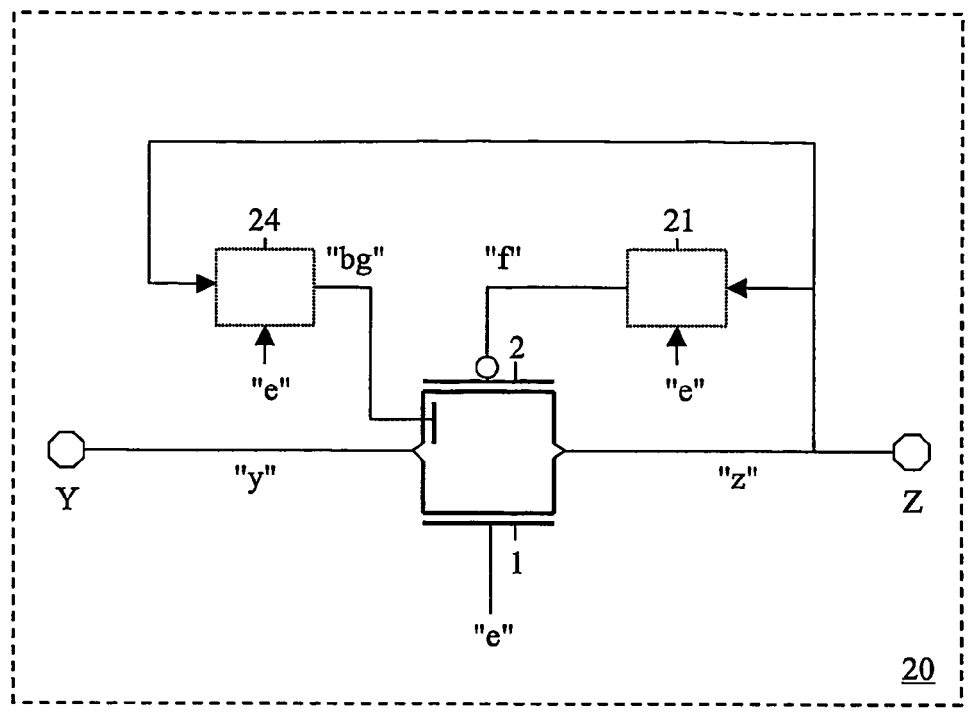
FIG. 1 shows in block diagram form a switch according to the invention comprising a circuit and a further circuit.

The switch 20 according to the invention shown in FIG. 1 comprises a first transistor 1 of which a first main electrode is coupled to a first in/output Y for guiding a first in/output signal "y" and of which a second main electrode is coupled to a second in/output Z for guiding a second in/output signal "z" and of which a control electrode receives a first control signal "e". The switch 20 further comprises a second transistor 2 of which a first main electrode is coupled to the first in/output Y and of which a second main electrode is coupled to the second in/output Z and of which a control electrode receives a second control signal "f" from a circuit 21 and of which a backgate receives a backgate signal "bg" from a circuit 24. Circuit 21 receives the second in/output signal "z" and the first control signal "e" for in response generating the second control signal "f". Circuit 24 receives the second in/output signal "z" and the first control signal "e" for in response generating the backgate signal "bg".

Figure 2:
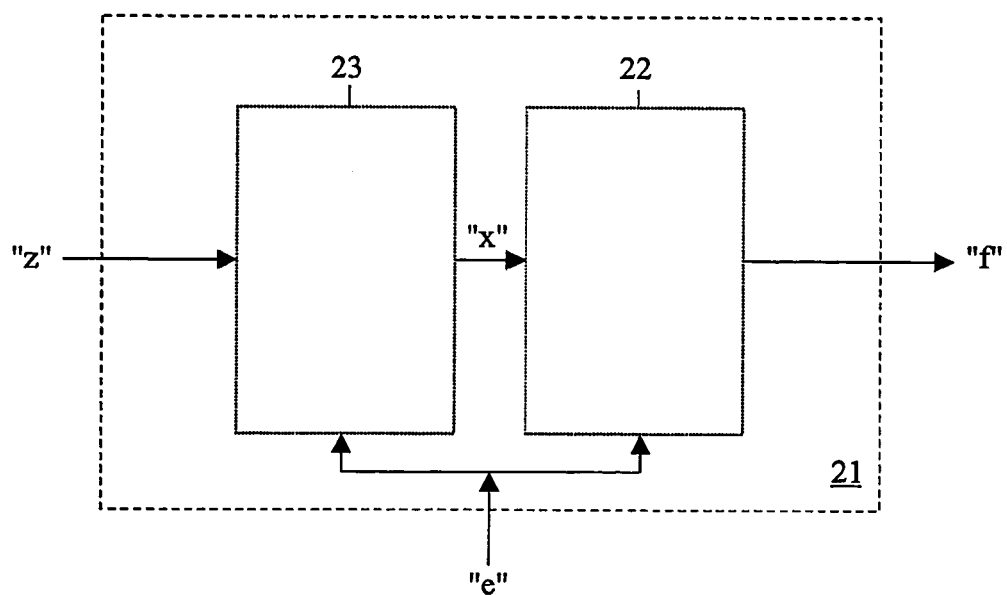
FIG. 2 shows in block diagram form a circuit for a switch according to the invention.

The circuit 21 shown in FIG. 2 comprises a generator 22 for receiving the first control signal "e" and a signal "x" and for generating the second control signal "f". The circuit 21 further comprises a detector 23 for receiving the first control signal "e" and the second in/output signal "z" and for generating the signal "x".

Figure 3:
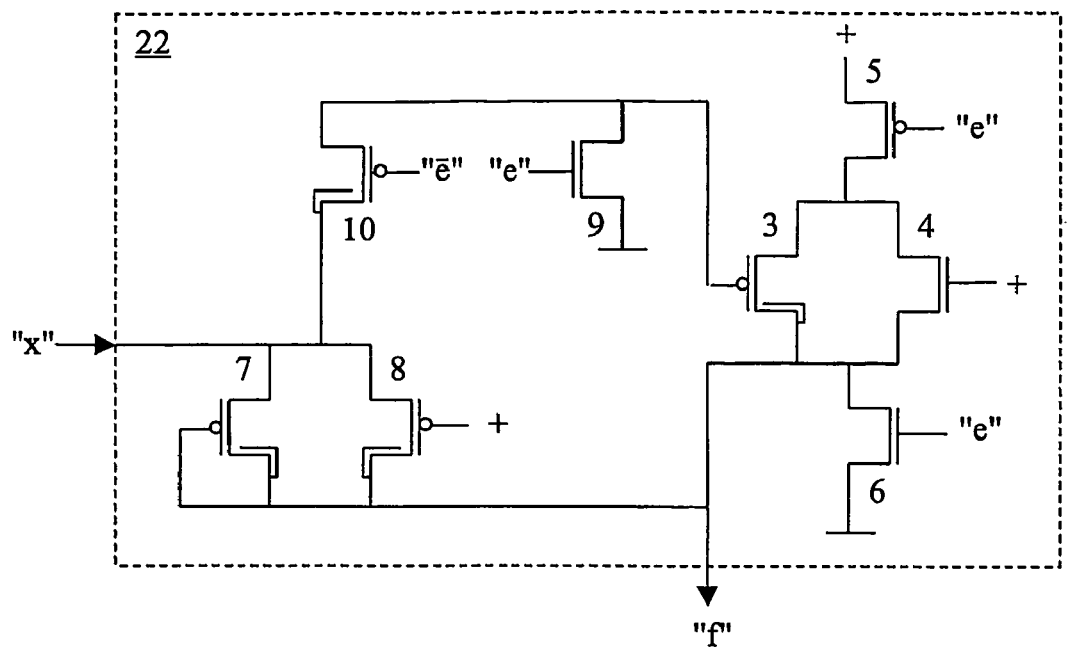
FIG. 3 shows in block diagram form a generator of a circuit for a switch according to the invention.

The generator 22 shown in FIG. 3 comprises a third and a fourth transistor 3,4 of which first main electrodes are coupled to each other and second main electrodes are coupled to each other, which first main electrodes are further coupled to a first main electrode of a fifth transistor 5, which second main electrodes are further coupled to first main electrodes of a sixth, seventh and eighth transistor 6,7,8 for generating the second control signal "f", with a control electrode of the third transistor 3 being coupled to first main electrodes of a ninth and a tenth transistor 9,10, with second main electrodes of the seventh, eighth and tenth transistor 7,8,10 being coupled to each other for receiving the signal "x" from the detector 23, with a control electrode of the seventh transistor 7 being coupled to the first main electrode of the seventh transistor 7, with a control electrode of the fifth transistor 5 receiving the first control signal "e", with control electrodes of the sixth and ninth transistor 6,9 receiving the first control signal "e", with a control electrode of the tenth transistor 10 receiving the inverted first control signal "ē", with a control electrode of the fourth transistor 4, a second main electrode of the fifth transistor 5 and a control electrode of the eighth transistor 8 being coupled to the voltage supply +, and with second main electrodes of the sixth and ninth transistor 6,9 being coupled to ground.

Figure 4:
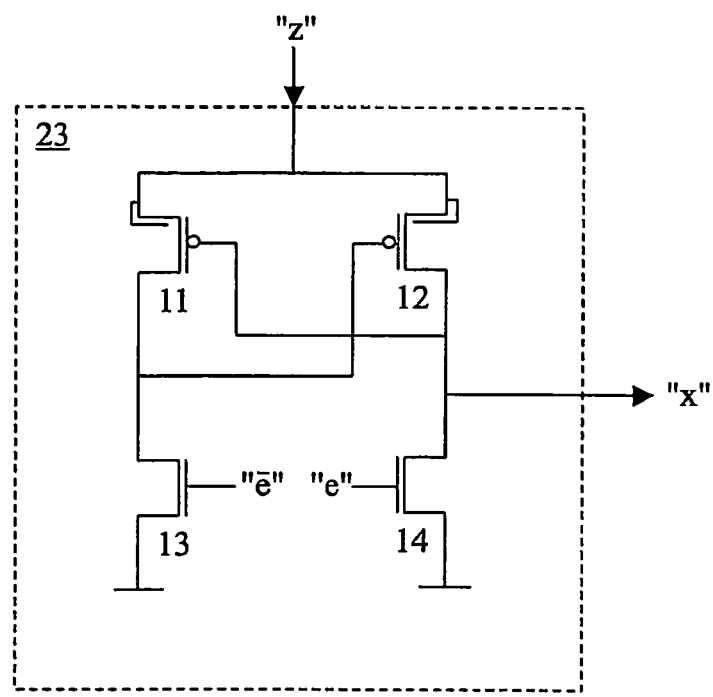
FIG. 4 shows in block diagram form a detector of a circuit for a switch according to the invention.

The detector 23 shown in FIG. 4 comprises an eleventh and a twelfth transistor 11,12 of which first main electrodes are coupled to each other for receiving the second in/output signal "z" or a derived version thereof (like for example a filtered version), with a second main electrode of the eleventh transistor 11 being coupled to a control electrode of the twelfth transistor 12 and to a first main electrode of a thirteenth transistor 13, with a second main electrode of the twelfth transistor 12 being coupled to a control electrode of the eleventh transistor 11 and to a first main electrode of a fourteenth transistor 14 and to the second main electrodes of the seventh, eighth and tenth transistor 7,8,10 for supplying the signal "x", with a control electrode of the thirteenth transistor 13 receiving the inverted first control signal "ē", with a control electrode of the fourteenth transistor 14 receiving the first control signal "e", and with second main electrodes of the thirteenth and fourteenth transistor 13,14 being coupled to ground.

Figure 5:
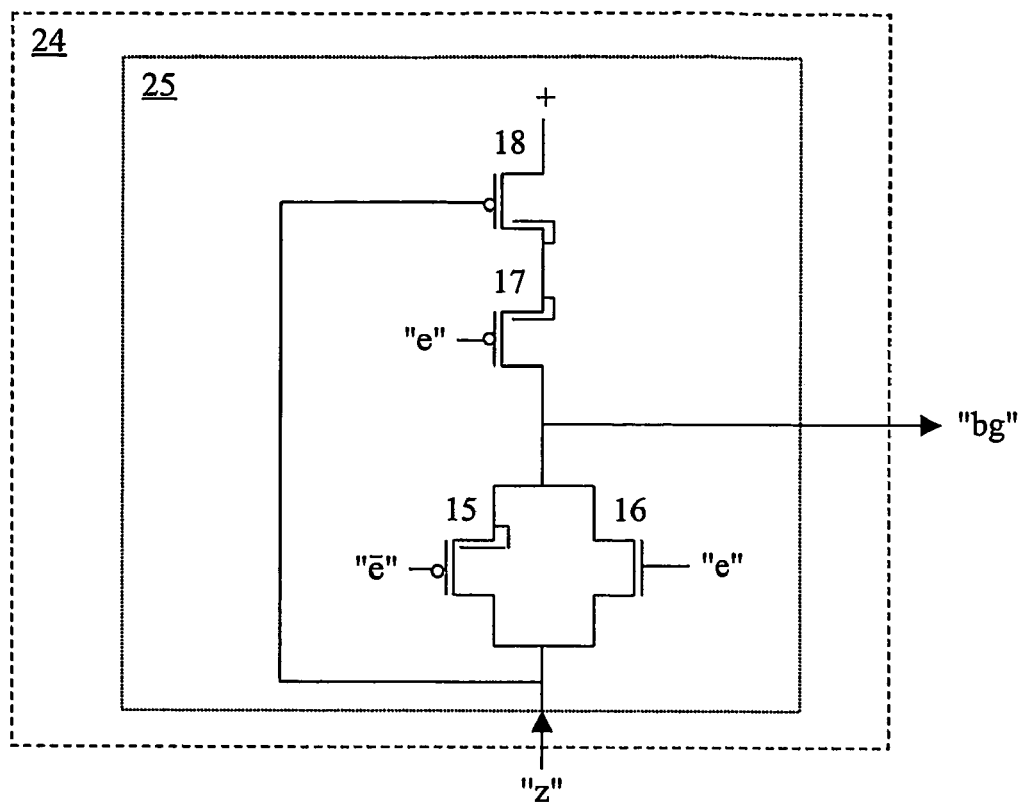
FIG. 5 shows in block diagram form a further generator of a further circuit for a switch according to the invention.
Figure 6:
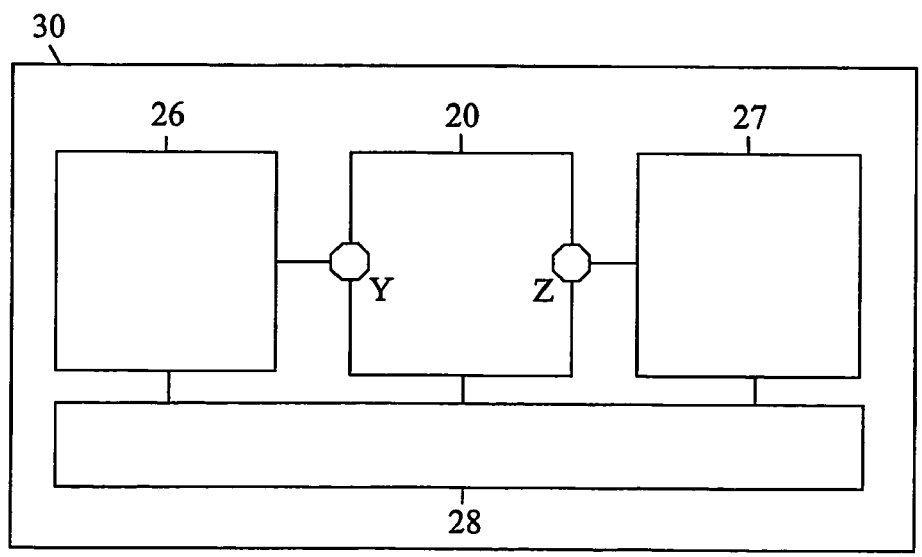
FIG. 6 shows in block diagram form an apparatus according to the invention comprising a switch according to the invention.

The further circuit 24 shown in FIG. 5 comprises a further generator 25 for receiving the first control signal "e" and the second in/output signal "z" and for generating the backgate signal "bg". The further generator 25 comprises a fifteenth and a sixteenth transistor 15,16 of which first main electrodes are coupled to each other for receiving the second in/output signal "z" or a derived version thereof (like for example a filtered version) and second main electrodes are coupled to each other and to a first main electrode of a seventeenth transistor 17 for generating the backgate signal "bg", with a second main electrode of the seventeenth transistor 17 being coupled to a first main electrode of an eighteenth transistor 18, with control electrodes of the sixteenth and fifteenth transistor 15 receiving the inverted first control signal "ē", with a control electrode of the seventeenth transistor 17 receiving the first control signal "e", with a control electrode of the eighteenth transistor 18 receiving the second in/output signal "z", and with a second main electrode of the eighteenth transistor 18 being coupled to the voltage supply +.

The second transistor 2 is a PMOS having a backgate for receiving the backgate signal "bg", with the third transistor 3 being a PMOS having a backgate coupled to its second main electrode, with the seventh and eighth transistor 7,8 each being a PMOS having a backgate coupled to its first main electrode, with the tenth transistor 10 being a PMOS having a backgate coupled to its second main electrode, with the eleventh and twelfth transistor 11,12 each being a PMOS having a backgate coupled to its first main electrode, with the fifteenth and seventeenth transistor 15,17 each being a PMOS having a backgate coupled to its second main electrode, with the eighteenth transistor 18 being a PMOS having a backgate coupled to its first main electrode, with the fifth transistor 5 being a PMOS having a backgate coupled to the voltage supply, and with all other transistors 1,4,6,9,13,14,16 each being a NMOS having a backgate coupled to ground.

In an enable mode with the first control signal "e" having a first value like for example a voltage amplitude substantially equal to the voltage of the voltage supply, the generator 22 generates the second control signal "f" having a second value like for example a voltage amplitude substantially equal to the ground voltage. This is the result of the sixth transistor 6 being in a conductive state. As a result, the first and second transistor 1,2 are in a conducting state and, thus, signal can transferred between 'Y' and 'Z' via the switch 20.

In a disable mode with the first control signal "e" having the second value, the generator 22 generates the second control signal "f" having the first value in case of a value of the second in/output signal "z" being smaller than the first value and having the value of the second in/output signal "z" in case of the value of the second in/output signal "z" being larger than the first value. This is the result of the twelfth and thirteenth transistors 12,13 in the detector 23 being in a conductive state, which causes the signal "x" to be substantially equal to the second in/output signal "z". In case of a value of the second in/output signal "z" being smaller than the first value, the seventh, eighth and tenth transistor 7,8,10 are in a non-conducting state, and the second control signal "f" gets the first value via the fifth transistor 5 which is in a conductive state. In case of a value of the second in/output signal "z" being larger than the first value, the seventh, eighth and tenth transistor 7,8,10 are in a conducting state, and the second control signal "f" gets the value of the second in/output signal "z" via the seventh/eighth transistor 7,8. The tenth transistor 10 turns off the third transistor 3, thereby blocking the current path between the second control signal "f" and the voltage supply.

In an enable mode with the first control signal "e" having the first value, the further generator 25 generates the backgate signal "bg" having a value of the in/output signal "z". This is the result of the fifteenth and sixteenth transistor 15,16 being in a conductive state. In a disable mode with the first control signal "e" having the second value, the further generator 25 generates the backgate signal "bg" having the first value in case of a value of the in/output signal "z" being smaller than the first value and having the value of the in/output signal "z" in case of the value of the in/output signal "z" being larger than the first value. This is the result of the fifteenth and sixteenth transistor 15,16 being in a non-conductive state. In case of a value of the in/output signal "z" being smaller than the first value, both the seventeenth and eighteenth transistor 17,18 are conducting and the backgate signal "bg" gets the first value. In case of a value of the in/output signal "z" being larger than the first value, only the fifteenth transistor 15 is conducting while the eighteenth transistor 18 is non-conducting and the backgate signal "bg" gets the value of the in/output signal "z".

The apparatus 30 according to the invention comprises a switch 20 according to the invention and further comprises a first stage 26 coupled to the first in/output Y of the switch 20 and a second stage 27 coupled to the second in/output Z of the switch 20. Examples of such an apparatus 30 are audio/video transceivers like mobile phones and further audio/video equipment. The first stage 26 of the apparatus 30 for example corresponds with a high-frequency stage and/or a modulating/demodulating stage and the second stage 27 of the apparatus 30 for example corresponds with a low-frequency stage and/or an amplifying stage. The first in/output Y may be an input, with the second in/output Z then being an output, or vice versa, due to the analog switch 20 being a so-called bidirectional switch.

Circuit 21 and further circuit 24 receive the second in/output signal "z". Alternatively the first in/output signal "y" may be used for generating the second control signal "f" and the backgate signal "bg". Or, in addition, four circuits may be used, one pair for generating the second control signal "f" in response to the first and second in/output signal "y","z" and the first control signal "e", and one other pair for generating the backgate signal "bg" in response to the first and second in/output signal "y","z" and the first control signal "e", whereby some combining circuitry will need to be added for combining the results of each pair of circuits.

Fluctuations in signals and values are possible, inter alia, due to parasitic or non-parasitic) resistances, capacitances, inductancies, and due to transistor losses, inverter losses etc. Of the seventh and eighth transistor 7,8, only one would have been sufficient, so one of them can be deleted with generator 22 still functioning properly. Usually, the main electrode of a PMOS 3,7,8,10,11,12,15,17,18 which is coupled to its backgate is called the source, with the other main electrode then being the drain. The backgate is coupled to one of the main electrodes of the PMOS 3,7,8,10,11,12, 15,17,18 in such a way that the parasitic backgate diode does not cause any problems (it should be in a non-conducting state).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention is based upon an insight, inter alia, that the second transistor is mainly responsible for the problems occurring in case of an amplitude voltage of the in/output signal at an in/output of the switch exceeding the supply voltage used for operating the switch, and is based upon a basic idea, inter alia, that the second control signal for controlling this second transistor should be generated in response to the first control signal and by taking into account the in/output signal at an in/output of the switch.

The invention solves the problem, inter alia, of providing a switch which functions relatively well, even in case of an amplitude voltage of the in/output signal at an in/output of the switch exceeding the supply voltage used for operating the switch, and is advantageous, inter alia, in that larger amplitude voltages of the in/output signal at an in/output of the switch can be handled without the need to increase the supply voltage up to the level of the in/output signal, whereby the disadvantageous clipping and leaking is strongly reduced. The switch according to the invention handles in/output signals having an amplitude voltage exceeding the supply voltage better than prior art switches. This also helps with respect to the portability of the switch in different systems and in-between different systems, where power supplies are different from each other and/or from the power supply of the switch.

The invention claimed is:

1. A switch comprising:
    a first transistor with main electrodes constituting in/outputs of the switch and with a control electrode constituting a first control input of the switch for in response to a first control signal controlling the first transistor;
    a second transistor with main electrodes constituting the in/outputs of the switch and with a control electrode constituting a second control input of the switch for in response to a second control signal controlling the second transistor; and
    a circuit for in response to the first control signal and an in/output signal at an in/output of the switch generating the second control signal, wherein the circuit comprises a generator for, in an enable mode with the first control signal having a first value, generating the second control signal having a second value;
    wherein the generator comprises a third and a fourth transistor of which first main electrodes are coupled to each other and second main electrodes are coupled to each other, which first main electrodes are further coupled to a first main electrode of a fifth transistor which second main electrodes are further coupled to first main electrodes of a sixth seventh and eighth transistor for generating the second control signal with a control electrode of the third transistor being coupled to first main electrodes of a ninth and a tenth transistor, with second main electrodes of the seventh eighth and tenth transistor being coupled to each other, with a control electrode of the seventh transistor being coupled to the first main electrode of the seventh transistor and with control electrodes of the fifth sixth ninth and tenth transistor receiving the first control signal or a derived version thereof.

2. The switch as defined in claim 1, wherein the circuit further comprises
    a detector for, in a disable mode with the first control signal having the second value, supplying the in/output signal to the generator for generating the second control signal having the first value in case of a value of the in/output signal being smaller than the first value and having the value of the in/output signal in case of the value of the in/output signal being larger than the first value.

3. The switch as defined in claim 1, further comprising
    a further circuit for in response to the first control signal and an in/output signal at an in/output of the switch generating a backgate signal destined for the second transistor.

4. The switch as defined in claim 3, wherein the further circuit comprises
    a further generator for, in an enable mode with the first control signal having a first value, generating the backgate signal having a value of the in/output signal and for, in a disable mode with the first control signal having a second value, generating the backgate signal having the first value in case of a value of the in/output signal being smaller than the first value and having the value of the in/output signal in case of the value of the in/output signal being larger than the first value.

5. The switch as defined in claim 1, wherein a detector comprises an eleventh and a twelfth transistor of which first main electrodes are coupled to each other for receiving the in/output signal or a derived version thereof, with a second main electrode of the eleventh transistor being coupled to a control electrode of the twelfth transistor and to a first main electrode of a thirteenth transistor with a second main electrode of the twelfth transistor being coupled to a control electrode of the eleventh transistor and to a first main electrode of a fourteenth transistor and to the second main electrodes of the seventh eighth and tenth transistor, with control electrodes of the thirteenth and fourteenth transistor receiving the first control signal or a derived version thereof.

6. The switch as defined in claim 1, wherein a further generator comprises a fifteenth and a sixteenth transistor of which first main electrodes are coupled to each other for receiving the in/output signal or a derived version thereof and second main electrodes are coupled to each other and to a first main electrode of a seventeenth transistor for generating a backgate signal with a second main electrode of the seventeenth transistor being coupled to a first main electrode of an eighteenth transistor with control electrodes of the fifteenth sixteenth and seventeenth transistor receiving the first control signal or a derived version thereof, and with a control electrode of the eighteenth transistor receiving the in/output signal or a derived version thereof.

7. The switch as defined in claim 6, wherein the second transistor is a PMOS having a backgate for receiving the backgate signal with the third transistor being a PMOS having a backgate coupled to its second main electrode, with the seventh and eighth transistor each being a PMOS having a backgate coupled to its first main electrode, with the tenth transistor being a PMOS having a backgate coupled to its second main electrode, with the eleventh and twelfth transistor each being a PMOS having a backgate coupled to its first main electrode, with the fifteenth and seventeenth transistor each being a PMOS having a backgate coupled to its second main electrode, with the eighteenth transistor being a PMOS having a backgate coupled to its first main electrode, and with all other transistors each being a NMOS.

8. An apparatus comprising a switch as defined in claim 1; and further comprising a first stage coupled to a first in/output of the switch and a second stage coupled to a second in/output of the switch.

9. A switch comprising:
a first transistor with main electrodes constituting in/outputs of the switch and with a control electrode constituting a first control input of the switch for in response to a first control signal controlling the first transistor;
a second transistor with main electrodes constituting the in/outputs of the switch and with a control electrode constituting a second control input of the switch for in response to a second control signal controlling the second transistor; and
a circuit for in response to the first control signal and an in/output signal at an in/output of the switch generating the second control signal, wherein the circuit comprises a generator for, in an enable mode with the first control signal having a first value, generating the second control signal having a second value;
wherein the generator comprises a third and a fourth transistor of which first main electrodes are coupled to each other and second main electrodes are coupled to each other, which first main electrodes are further coupled to a first main electrode of a fifth transistor for generating the second control signal.

10. The switch as defined in claim 9, wherein the circuit further comprises
a detector for, in a disable mode with the first control signal having the second value, supplying the in/output signal to the generator for generating the second control signal having the first value in case of a value of the in/output signal being smaller than the first value and having the value of the in/output signal in case of the value of the in/output signal being larger than the first value.

11. The switch as defined in claim 9, further comprising a further circuit for in response to the first control signal and an in/output signal at an in/output of the switch generating a backgate signal destined for the second transistor.

12. The switch as defined in claim 11, wherein the further circuit comprises
a further generator for, in an enable mode with the first control signal having a first value, generating the backgate signal having a value of the in/output signal and for, in a disable mode with the first control signal having a second value, generating the backgate signal having the first value in case of a value of the in/output signal being smaller than the first value and having the value of the in/output signal in case of the value of the in/output signal being larger than the first value.

13. The switch as defined in claim 9, wherein a detector comprises an eleventh and a twelfth transistor of which first main electrodes are coupled to each other for receiving the in/output signal or a derived version thereof, with a second main electrode of the eleventh transistor being coupled to a control electrode of the twelfth transistor and to a first main electrode of a thirteenth transistor with a second main electrode of the twelfth transistor being coupled to a control electrode of the eleventh transistor and to a first main electrode of a fourteenth transistor and to the second main electrodes of a seventh eighth and tenth transistor, with control electrodes of the thirteenth and fourteenth transistor receiving the first control signal or a derived version thereof.

14. The switch as defined in claim 9, wherein a further generator comprises a fifteenth and a sixteenth transistor of which first main electrodes are coupled to each other for receiving the in/output signal or a derived version thereof and second main electrodes are coupled to each other and to a first main electrode of a seventeenth transistor for generating a backgate signal with a second main electrode of the seventeenth transistor being coupled to a first main electrode of an eighteenth transistor with control electrodes of the fifteenth sixteenth and seventeenth transistor receiving the first control signal or a derived version thereof, and with a control electrode of the eighteenth transistor receiving the in/output signal or a derived version thereof.

15. The switch as defined in claim 14, wherein the second transistor is a PMOS having a backgate for receiving the backgate signal with the third transistor being a PMOS having a backgate coupled to its second main electrode, with a seventh and eighth transistor each being a PMOS having a backgate coupled to its first main electrode, with a tenth transistor being a PMOS having a backgate coupled to its second main electrode, with a eleventh and twelfth transistor each being a PMOS having a backgate coupled to its first main electrode, with the fifteenth and seventeenth transistor each being a PMOS having a backgate coupled to its second main electrode, with the eighteenth transistor being a PMOS having a backgate coupled to its first main electrode, and with all other transistors each being a NMOS.

16. An apparatus comprising a switch as defined in claim 9; and further comprising a first stage coupled to a first in/output of the switch and a second stage coupled to a second in/output of the switch.

* * * * *